(12) United States Patent
Min et al.

(10) Patent No.: US 10,015,877 B2
(45) Date of Patent: Jul. 3, 2018

(54) CIRCUIT BOARD COMPRISING HEAT TRANSFER STRUCTURE

(71) Applicant: SAMSUNG ELECTRO-MECHANICS CO., LTD., Suwon-si (KR)

(72) Inventors: Tae Hong Min, Suwon-si (KR); Myung Sam Kang, Hwaseong-si (KR); Jin Hyuk Jang, Hanam-si (KR); Young Gwan Ko, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 36 days.

(21) Appl. No.: 14/849,880

(22) Filed: Sep. 10, 2015

(65) Prior Publication Data

US 2016/0095201 A1    Mar. 31, 2016

(30) Foreign Application Priority Data

Sep. 30, 2014 (KR) .................. 10-2014-0130924

(51) Int. Cl.
| | |
|---|---|
| H05K 1/02 | (2006.01) |
| H01L 23/367 | (2006.01) |
| H01L 23/373 | (2006.01) |
| H01L 23/498 | (2006.01) |
| H01L 21/48 | (2006.01) |
| H01L 23/538 | (2006.01) |

(52) U.S. Cl.
CPC ....... *H05K 1/0204* (2013.01); *H01L 23/3677* (2013.01); *H01L 23/373* (2013.01); *H01L 23/49827* (2013.01); *H01L 21/4882* (2013.01); *H01L 23/5389* (2013.01); *H01L 2224/16235* (2013.01); *H01L 2224/16265* (2013.01); *H01L 2924/15311* (2013.01); *H05K 1/0206* (2013.01); *H05K 1/0207* (2013.01); *H05K 2201/0323* (2013.01)

(58) Field of Classification Search
CPC . H05K 1/0204; H05K 1/0207; H01L 23/3677
USPC ................................ 361/719, 720; 174/252
See application file for complete search history.

(56) References Cited

U.S. PATENT DOCUMENTS

| | | | | |
|---|---|---|---|---|
| 5,089,443 A | * | 2/1992 | Kerey | H01L 21/4882 148/241 |
| 5,958,572 A | * | 9/1999 | Schmidt | H01L 23/3733 174/258 |
| 6,519,154 B1 | * | 2/2003 | Chiu | H01L 23/367 165/185 |
| 6,758,263 B2 | * | 7/2004 | Krassowski | F28F 13/00 165/185 |

(Continued)

FOREIGN PATENT DOCUMENTS

| | | |
|---|---|---|
| JP | 11-284300 A | 10/1999 |
| JP | 2000-349435 A | 12/2000 |

*Primary Examiner* — Mukund G Patel
(74) *Attorney, Agent, or Firm* — NSIP Law

(57) ABSTRACT

A circuit board comprises a first heat transfer structure including graphite or graphene, wherein at least a portion of the first heat transfer structure is disposed inside an insulating member and a primer layer is disposed on a surface of the first heat transfer structure. The first heat transfer structure may comprise a plurality of monomers, the monomers including a primer layer disposed on at least one surface of at least one layer of graphite or graphene.

21 Claims, 8 Drawing Sheets

(56) References Cited

U.S. PATENT DOCUMENTS

| | | | | |
|---|---|---|---|---|
| 7,297,399 B2* | 11/2007 | Zhang | ............... | F28F 13/00 |
| | | | | 361/704 |
| 2003/0002260 A1* | 1/2003 | Hasebe | ............... | H01L 23/142 |
| | | | | 361/720 |
| 2004/0151882 A1* | 8/2004 | Tani | ............... | H05K 1/056 |
| | | | | 428/209 |
| 2005/0282381 A1* | 12/2005 | Cohen | ............... | H01L 23/3677 |
| | | | | 438/637 |
| 2007/0215381 A1* | 9/2007 | Vasoya | ............... | H05K 3/4641 |
| | | | | 174/262 |
| 2008/0076276 A1* | 3/2008 | Takezaki | ............... | H05K 1/0207 |
| | | | | 439/71 |
| 2013/0337273 A1* | 12/2013 | Boday | ............... | H01L 23/373 |
| | | | | 428/447 |
| 2014/0126156 A1* | 5/2014 | Naganuma | ............... | H05K 1/0206 |
| | | | | 361/719 |

* cited by examiner

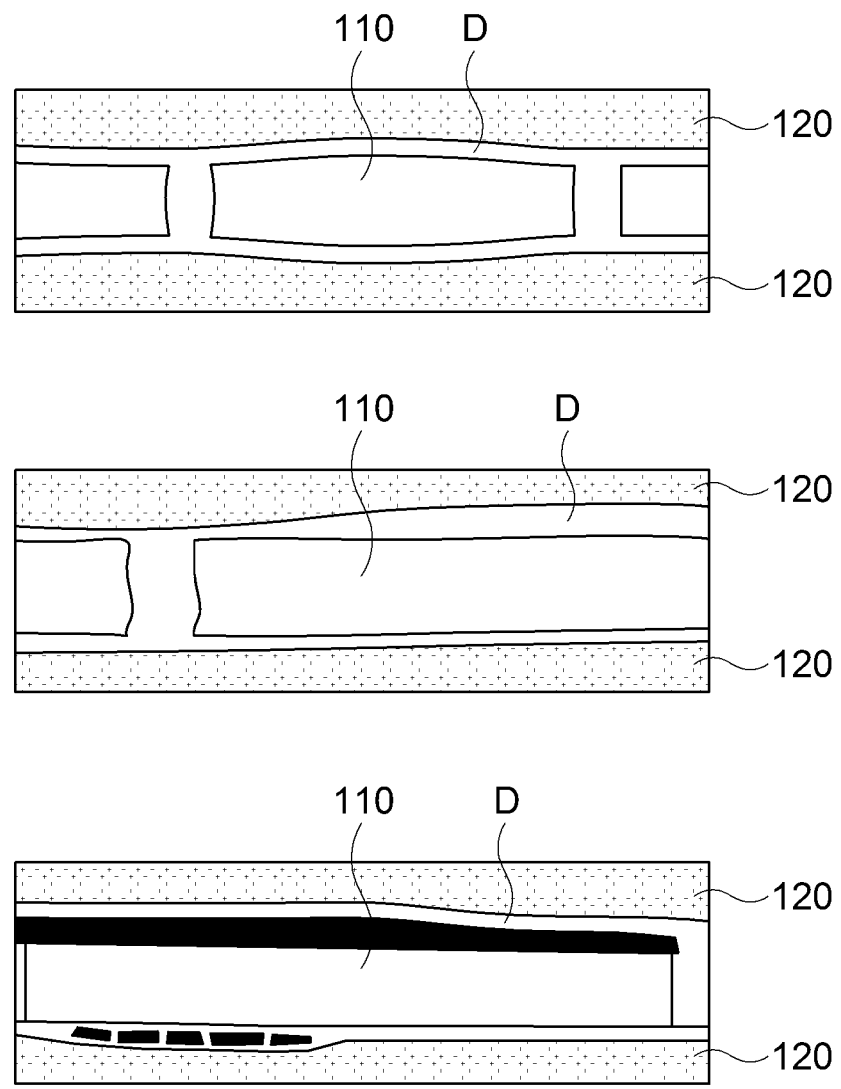

CIRCUIT BOARD COMPRISING HEAT TRANSFER STRUCTURE

CROSS-REFERENCE TO RELATED APPLICATIONS

This application claims the benefit under 35 U.S.C. Section 119 of priority to Korean Patent Application Serial No. 10-2014-0130924, filed Sep. 30, 2014, the entirety of which is hereby incorporated by reference.

TECHNICAL FIELD

The present disclosure relates to a circuit board. In particular, a circuit board may comprise a first heat transfer structure including graphite or graphene, and at least a portion of the first heat transfer structure may be disposed inside an insulating member with a primer layer disposed on a surface of the first heat transfer structure. The first heat transfer structure may comprise a plurality of monomers, the monomers including a primer layer disposed on at least one surface of at least one layer of graphite or graphene.

BACKGROUND

To deal with weight reduction, miniaturization, high speed, multifunction, and high performance trends in electronic devices, forming a plurality of wiring layers on circuit boards such as printed circuit boards (PCB), known as multilayer board technologies have been researched. Moreover, a technology to equip electronic components such as active elements or passive elements on the multilayer circuit board has been researched.

Meanwhile, due to multifunction and the high performance of application processors connected to the multilayer circuit board, the heat-conducting requirements have significantly grown.

SUMMARY

An aspect of the present disclosure may provide a circuit board wherein it is possible to achieve at least one of the following: enhancement of the radiation performance of the circuit board, increased reliability, reduced noise, and increased efficiency in manufacturing.

Technical aspects of the present inventive concept are not limited to the above-mentioned ones, and other technical aspects not mentioned above would clearly be understood by those skilled in the art through the following description.

To achieve the aspects mentioned above, the present inventive concept provides a circuit board in accordance with an exemplary embodiment of the present inventive concept including a first heat transfer structure, wherein the first heat transfer structure comprises a substance with high heat conductivity.

In one embodiment, the first heat transfer structure may include graphite or graphene.

Meanwhile, a primer layer may be disposed on a surface of the first heat transfer structure.

In one embodiment of the present inventive concept, a circuit board may comprise a first heat transfer structure including graphite or graphene; an insulating member inside which at least a portion of the first heat transfer structure is disposed; and a primer layer disposed on a surface of the first heat transfer structure.

The circuit board may further comprise a via having a first surface in contact with the first heat transfer structure and a metal pattern in contact with a second surface of the via.

The circuit board may further comprise a joining member in contact with the metal pattern and a first electronic component in contact with the joining member.

The first electronic component may include a first area and a second area, the temperature of the second area rising to a higher temperature than that of the first area when the first electronic component is operated, and a portion of the second area being in contact with the joining member.

The first heat transfer structure may be a polyhedron and a plurality of vias may be in contact with the same surface of the first heat transfer structure.

The primer layer may include silanic primers.

The circuit board may further comprise a first via in contact with the first heat transfer structure, a first surface of the first via being in contact with the graphite or the graphene of the first heat transfer structure; a first metal pattern in contact with a second surface of the first via; a second via in contact with the first heat transfer structure, a first surface of the second via being in contact with the graphite or the graphene of the first heat transfer structure; and a second metal pattern in contact with a second surface of the second via.

The circuit board may further comprise a first joining member in contact with the first metal pattern and a first electronic component in contact with the first joining member.

The circuit board may further comprise a second joining member in contact with the second metal pattern; an additional board in contact with the second joining member, wherein heat generated by the first electronic component may be transferred to the additional board through the first joining member, the first metal pattern, the first via, the first heat transfer structure, the second via, the second metal pattern, and the second joining member.

The second joining member may be coupled to a surface of a heat sink comprising a heat-conductive material.

The second joining member may comprise a heat-conductive material.

The first electronic component may include a first area and a second area, the second area having a clock speed higher than that of the first area, and a distance between the second area and the first joining member may be shorter than a distance between the first area and the first joining member.

The second joining member may be in contact with a top surface of a heat sink comprising a heat-conductive material, and the second joining member may comprise a heat-conductive material.

The first electronic component may be disposed on a top surface of the circuit board and at least a portion of the first heat transfer structure may be positioned below the first electronic component.

The circuit board may further comprise a second electronic component, wherein at least a portion of the second electronic component may be disposed inside the insulating member and at least a portion of the second electronic component may be positioned below the first electronic component.

The first electronic component may include a first area and a second area, the temperature of the second area rising to a higher temperature than that of the first area when the first electronic component is operated, and the second area may be closer to the first heat transfer structure than the first area.

The first heat transfer structure may comprise a plurality of monomers, the monomers including a primer layer disposed on at least one surface of at least one layer of graphite or graphene.

An XY plane of the graphite or the graphene of the monomer may be parallel to a vertical direction, and the monomer may be arranged in a Z direction of the graphite or the graphene.

The first heat transfer structure may be formed by a combination of a plurality of monomers equipped with primer layers disposed on an outer surface of the graphite or the graphene.

The first heat transfer structure may be a cylinder or a faceted cylinder and a plurality of vias are in contact with the same surface of the first heat transfer structure.

The circuit board according to claim 2, wherein the first heat transfer structure is a cylinder or a faceted cylinder and a plurality of vias are in contact with the same surface of the first heat transfer structure.

A second heat transfer structure may include graphite or graphene.

A thermal interface material may be disposed between the first heat transfer structure and the second heat transfer structure.

The thermal interface material may comprise at least one selected from the group consisting of a polymer-metal composition, a ceramic composition, and a carbon composition.

The primer layer may comprise at least one selected from the group consisting of isopropyl alcohol (IPA), acrylic silane, and 3-(trimethoxysilyl)propyl methacrylate.

A circuit board may comprise a core layer including graphite or graphene, an insulating layer disposed on a surface of the core layer, and a first heat transfer structure including graphite or graphene, wherein at least a portion of the first heat transfer structure is disposed in a cavity of the core layer.

The circuit board may further comprise a primer layer disposed on a surface of the first heat transfer structure.

The first heat transfer structure may comprise a plurality of monomers including graphite or graphene, wherein a primer layer is disposed on a surface of the monomers.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 11A is a view schematically showing a result of a reflow test with an insulating member in direct contact with the heat transfer structure;

DETAILED DESCRIPTION

Figure 1:
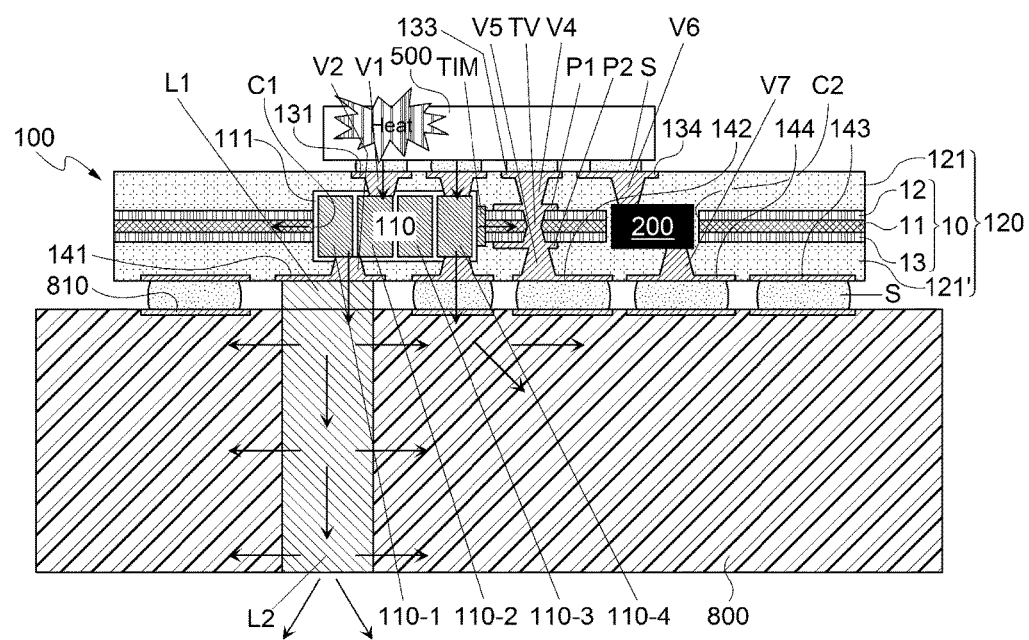
FIG. 1 is a cross-sectional view schematically showing a circuit board in accordance with an embodiment of the present inventive concept.

Advantages and features of the present inventive concept and methods of accomplishing the same will be apparent by referring to embodiments described below in detail in connection with the accompanying drawings. However, the present inventive concept is not limited to the embodiments disclosed below and may be implemented in various different forms. The exemplary embodiments are provided only for completing the disclosure of the present inventive concept and for fully representing the scope of the present inventive concept to those skilled in the art. Like reference numerals refer to like elements throughout the specification.

Terms used herein are provided to explain embodiments, not limiting the present inventive concept. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

For simplicity and clarity of illustration, the drawing figures illustrate the general manner of construction, and descriptions and details of well-known features and techniques may be omitted to avoid unnecessarily obscuring the discussion of the described embodiments of the inventive concept. Additionally, elements in the drawing figures are not necessarily drawn to scale. For example, the dimensions of some of the elements in the figures may be exaggerated relative to other elements to help improve understanding of embodiments of the present inventive concept. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the inventive concept described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the inventive concept described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

Hereinafter, configurations and operational effects of the present inventive concept will be described in detail with reference to the accompanying drawings.

Figure 2:
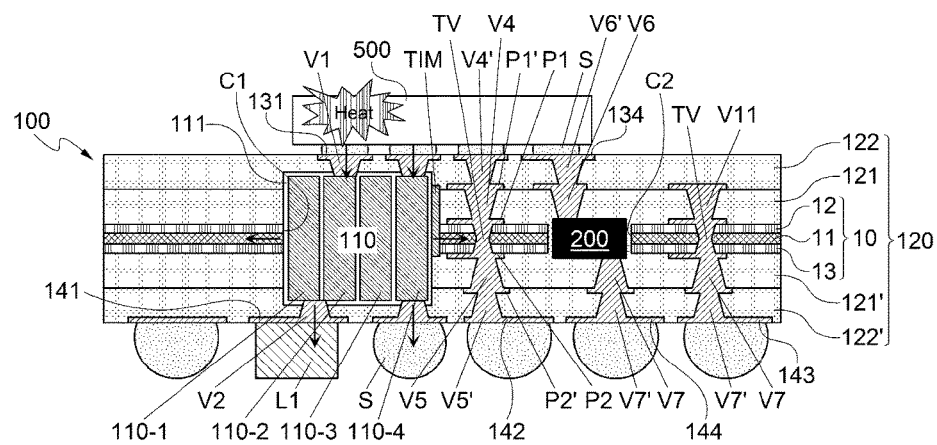
FIG. 2 is a cross-sectional view schematically showing the circuit board in accordance with another embodiment of the present inventive concept.
Figure 3:
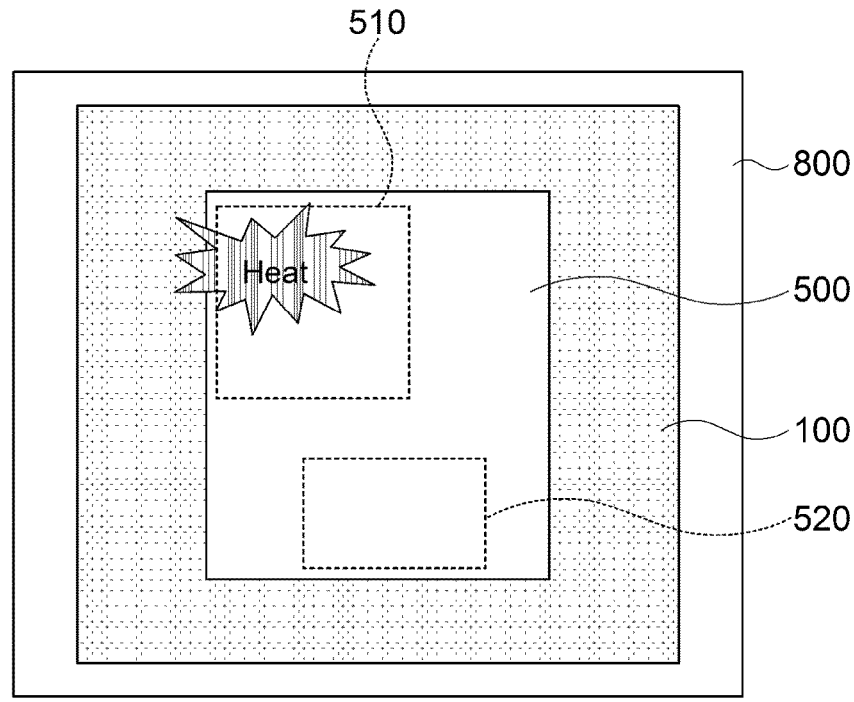
FIG. 3 is a plane view schematically showing the circuit board in accordance with an embodiment of the present inventive concept.
Figure 4:
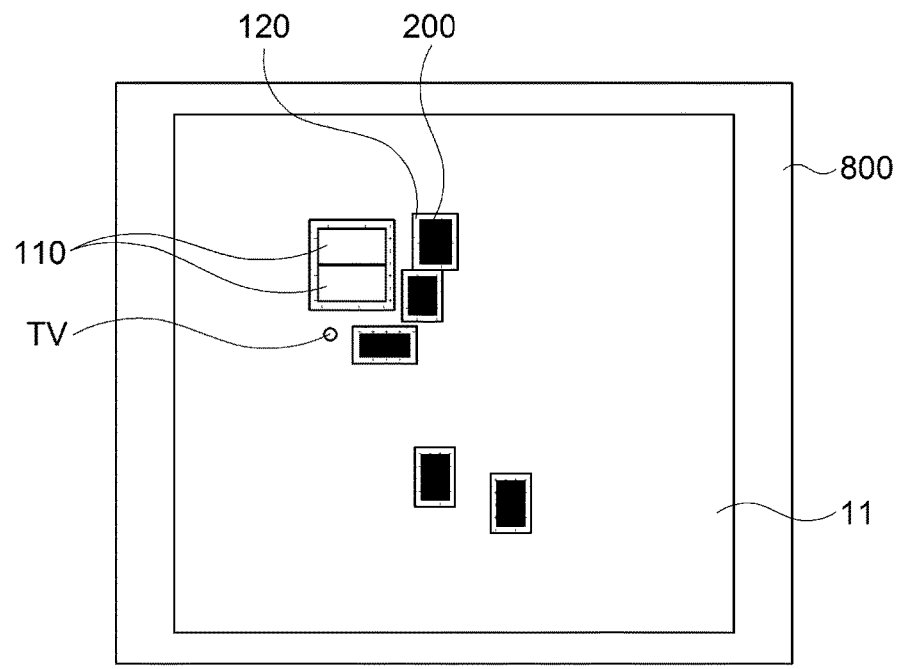
FIG. 4 is a horizontal view schematically showing the circuit board in accordance with an embodiment of the present inventive concept.
Figure 5:
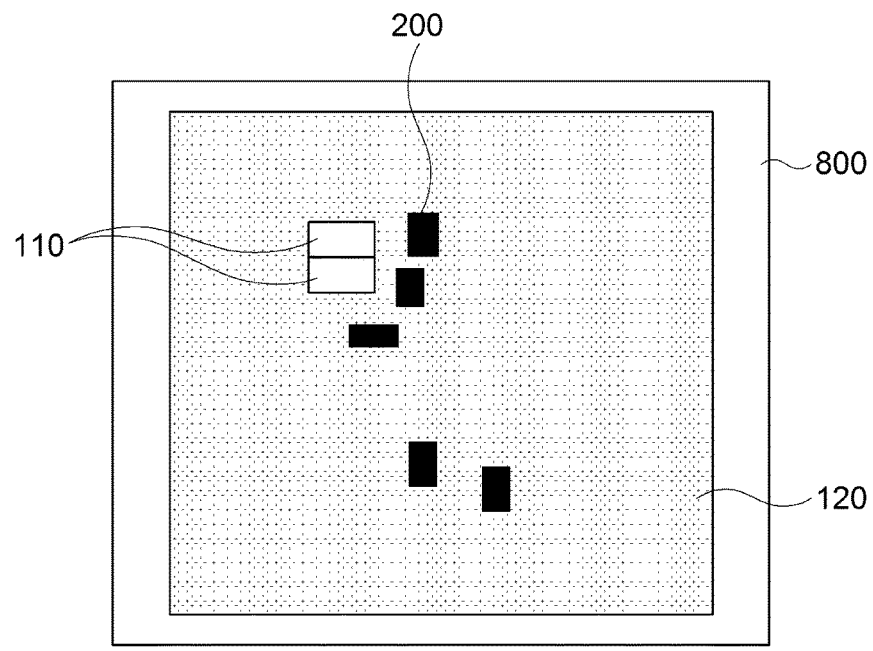
FIG. 5 is a horizontal view schematically showing the circuit board in accordance with an embodiment of the present inventive concept.
Figure 6:
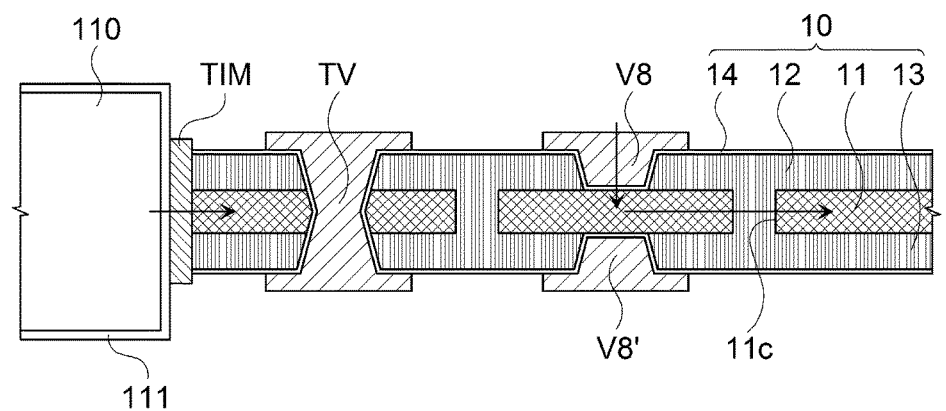
FIG. 6 is a partially extracted cross-sectional view schematically showing the circuit board in accordance with an embodiment of the present inventive concept.
Figure 7:
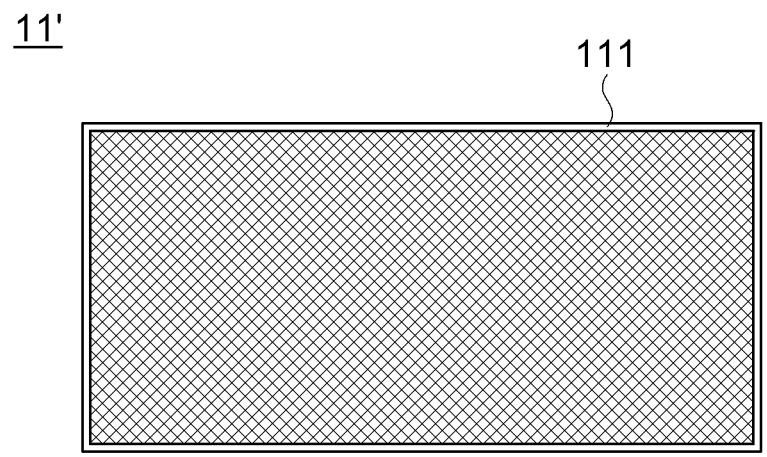
FIG. 7 is a drawing showing a second heat transfer structure in accordance with an embodiment of the present inventive concept.
Figure 8:
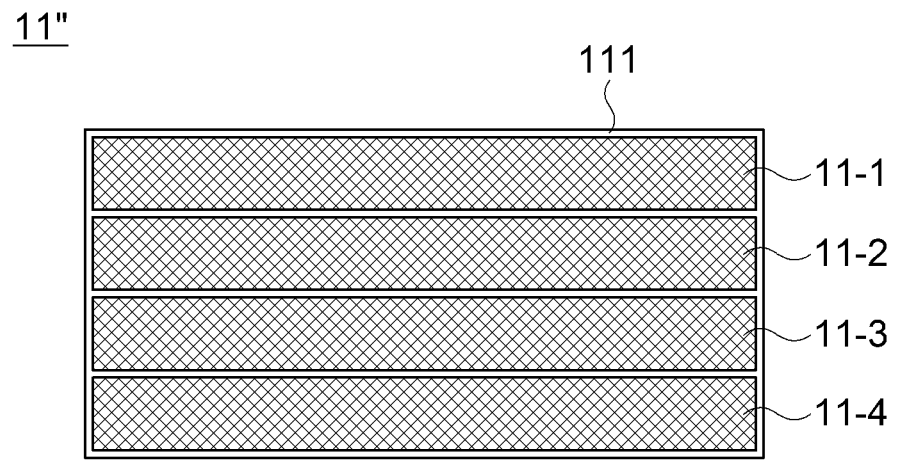
FIG. 8 is a view showing the second heat transfer structure in accordance with another embodiment of the present inventive concept.
Figure 9:
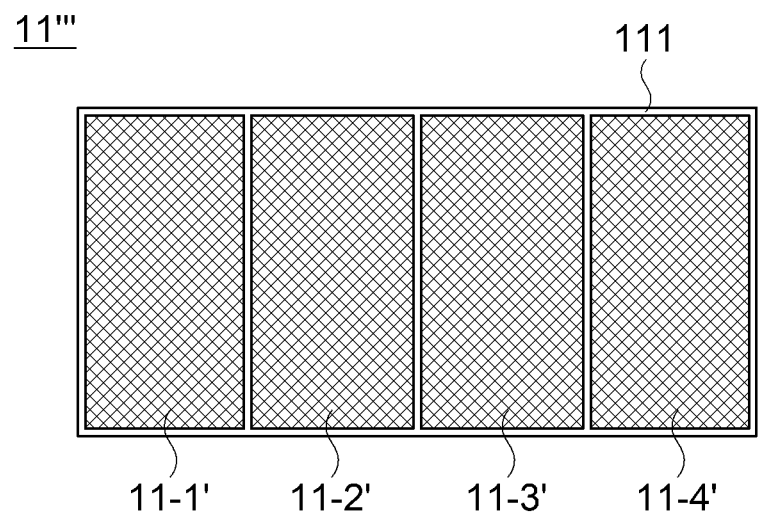
FIG. 9 is a view showing the second heat transfer structure in accordance with another embodiment of the present inventive concept.

FIG. 1 is a cross-sectional view schematically showing a circuit board 100 in accordance with an embodiment of the present inventive concept, FIG. 2 is a cross-sectional view schematically showing the circuit board 100 in accordance with another embodiment of the present inventive concept, FIG. 3 is a plane view schematically showing the circuit board 100 in accordance with an embodiment of the present inventive concept, FIG. 4 is a horizontal view schematically showing the circuit board 100 in accordance with an embodiment of the present inventive concept, FIG. 5 is a horizontal view schematically showing the circuit board 100 in accordance with another embodiment of the present inventive concept, FIG. 6 is a partially extracted cross-sectional view schematically showing the circuit board 100 in accordance with an embodiment of the present inventive concept, FIG. 7 is a drawing showing a second heat transfer structure in accordance with an embodiment of the present inventive concept, FIG. 8 is a view showing the second heat transfer structure in accordance with another embodiment of the present inventive concept and FIG. 9 is a view showing the second heat transfer structure in accordance with another embodiment of the present inventive concept.

The circuit board 100 in accordance with an embodiment of the present inventive concept includes a first heat transfer structure 110 and at least a portion of the first heat transfer structure 110 is disposed inside an insulating member. In one embodiment, the first heat transfer structure 110 comprises graphite or graphene and a primer layer 111 is disposed on an outer surface. In addition, the first heat transfer structure may be in the form of a polyhedron. In another embodiment, the first heat transfer structure 110 may be a cylinder or a faceted cylinder.

Here, the graphite or the graphene can be formed by stacking structures (or a sheet structure) layered of XY directions to a Z direction, and the thermal conductivity in the XY plane direction is superiorly high. Thus, if the XY plane of the graphite or the graphene is aligned to the heat transfer direction, heat can be effectively and quickly dispersed.

In one embodiment, the insulating member can be formed in one layer or a plurality of insulating layers. Here, in FIG. 1, although the insulating member consists of 3 insulating layers and the insulating layer placed at the central part is a core member 10, it is not limited thereto.

In one embodiment, the first heat transfer structure 110 is placed in a middle of the insulating member. If the core member 10 is equipped as shown, a cavity penetrating the core member 10 is formed so as to insert the first heat transfer structure into the cavity.

In one embodiment, a via formed on the insulating member may be in contact with the first heat transfer structure 110. The via placed on a top of the first heat transfer structure 110 is herein referred to as the first via V1 and the via placed on a bottom is herein referred to as the second via V2. Here, at least one metal pattern may be equipped on the insulating member, and below, the metal pattern that is in contact with the first via V1 is called the first metal pattern 131 and the metal pattern that is in contact with the second via V2 is called the second metal pattern 141. Also, a fourth via V4 and a fifth via V5 can be equipped on the insulating member, the metal pattern that is in contact with the fourth via V4 is called the third metal pattern 133 and the metal pattern that is in contact with the fifth via V5 is called the fifth metal pattern 142.

In one embodiment, the first heat transfer structure 110 may function as a heat absorber and this function can be improved by increasing the volume of the first heat transfer structure 110. Thus, as shown, the first heat transfer structure 110 may be formed in a pillar shape. By forming into a pillar shape and if the surface area at the bottom is identical, the volume of the first heat transfer structure 110 can be maximized. In addition, if the top or the bottom of the first heat transfer structure 110 is in a shape of a polygon, especially a rectangle, the trend to minimize a first electronic component 500, minimization of the circuit board 100, or the refining of a pattern pitch may be achieved. Also, as shown, the volume of the first heat transfer structure 110 is far larger than ordinary vias such as the first via V1 to a seventh via V7. Thus, a plurality of vias may be in contact with the surface of the first heat transfer structure 110, especially on the top or the bottom surface. Therefore, not only the top or the bottom surface area of the first heat transfer structure 110 is larger than ordinary vias, but the whole volume is at least two times larger. Thus, by absorbing the heat from a heat source quickly, the heat may be dispersed in a different path connected to the first heat transfer structure 110. Also, if the thickness of the first heat transfer structure 110 is increased, the distance between the first heat transfer structure 110 and a hot spot is reduced, therefore, the time needed for the heat of the hot spot to travel to the first heat transfer structure 110 may be reduced.

In one embodiment, a first electronic component 500 may be mounted on a side of the circuit board 100. Also, the circuit board may be mounted on one side of an additional board 800 such as a main board. Here, the first electronic component may be components such as an Application Processor (AP) and heat may be generated when operated.

Meanwhile, heat is generated when operating the first electronic component 500, and when detected, there is an area where the temperature is relatively higher due to severe heating. These areas are called hot spots. These hot spots may be formed on designated areas of the circuit board 100, especially on a whole or a section of the first electronic component 500. Also, these hot spots may be formed near the power terminal or areas relatively concentrated with switching elements.

On the other hand, the first electronic component 500 may each include an area of high performance and an area of low performance. For example, a processor containing elements that have a clock speed of 1.8 GHz and a processor containing elements that have a clock speed of 1.2 GHz may be equipped separately on the first electronic component 500. Referring to FIG. 3, in one embodiment, the first electronic component 500 may include a first unit area 510 and a second unit area 520. Here, the first unit area 510 processes an operation at a faster speed than the second unit area 520, and accordingly, consumes much more power and generates much more heat than the second unit area 520.

In circuit board 100 in accordance with one embodiment of the present inventive concept, the first heat transfer structure 110 is placed near the hot spot. Accordingly, heat generated from the hot spot is quickly delivered and sent to other areas of the circuit board 100 and the heat can be dispersed to other devices connected to the circuit board 100 such as the main board.

In one embodiment, at least a part of the first heat transfer structure 110 is placed on a vertical bottom area of the first electronic component 500.

Meanwhile, the circuit board 100 in accordance with one embodiment of the present inventive concept may be further equipped with a second electronic component 200. Here, the second electronic component 200 may be an electronic component such as a capacitor, an inductor, or a resistor.

If the first electronic component 500 is an application processor, a capacitor or such may be connected to the application processor to reduce the power noise. Here, the effect to reduce the power noise can be increased by shortening the distance between the capacitor and the application processor.

Thus, at least a part of the second electronic component 200 may be placed on the vertical bottom area of the first electronic component 500, therefore increasing the effect of reducing the power noise.

In one embodiment, most of the first heat transfer structure 110 may be placed on the vertical bottom area of the first electronic component 500. Also, the top surface area of the first heat transfer structure 110 may be smaller than the top surface area of the first electronic component 500. Moreover, the top surface area of the first heat transfer structure 110 may be determined to match with a width of the hot spot area of the first electronic component 500.

Accordingly, the heat of the hot spot may be quickly transferred to the first heat transfer structure 110. Also, it is advantageous in lightening the circuit board 100 and reducing warpage. In addition, the efficiency of a process to place the first heat transfer structure 110 on the circuit board 100 can be increased.

Meanwhile, most of the second electronic component 200 may be placed on the vertical bottom area of the first electronic component 500. Here, on the vertical bottom area of the first electronic component 500, the second electronic component 200 may be placed on an area where the above described first heat transfer structure 110 has not been placed. Also, the first heat transfer structure 110 may be placed at a closer area to the hot spot than the second electronic component 200.

Referring to FIGS. 1 to 4, it can be understood that the first heat transfer structure 110 and the second electronic component 200 may be inserted in the cavities equipped on a first core layer 11. That is, a first cavity C1 and a second cavity C2 are disposed on the core member 10, the first heat transfer structure 110 may be inserted in the first cavity C1 and the second electronic component 200 may be inserted in the second cavity C2. Also, the first heat transfer structure 110 and the second electronic component 200 may be closely placed on the vertical bottom area; and, in particular, the first heat transfer structure 110 may be placed especially near the hot spot area as shown in FIG. 4.

Accordingly, the heat from the hot spot can be quickly transferred while maximizing the effect to reduce the power noise due to the second electronic component 200.

In one embodiment, the first electronic component 500 may be attached to the circuit board 100 by solder S. That is, the first electronic component can be attached to the above-described components, such as the first metal pattern 131, the third metal pattern 133, and the seventh metal pattern 134 by solder S.

Also, the second metal pattern 141, the fourth metal pattern 142, the fifth metal pattern 143, and the sixth metal pattern 144 or the like of the circuit board 100 may be connected to the additional board 800 such as the main board through the solder S. In one embodiment, a third heat transfer structure L1 consisting of a substance and shape similar to the first heat transfer structure may be equipped between the second metal pattern 141 and the additional board 800, instead of a conventional solder S. That is, in order to quickly transfer the heat of the first heat transfer structure 110 to the additional board 800, the third heat transfer structure L1 consisting of a substance of high heat conductivity in a lump shape may be used to connect the second metal pattern to the additional board 800 instead of using the ordinary solder S. Also, a heat sink L2 may be equipped on the additional board to quickly receive and disperse the heat of the third heat transfer structure L1. This heat sink L2 is exposed in a top surface direction of the additional board 800, and if needed, it can also be exposed in a bottom surface direction to increase the efficiency of heat radiation.

Accordingly, the heat generated from the hot spot may be transferred to the additional board 800 through a path of the first metal pattern 131-the first via V1-the first heat transfer structure 110-the second via V2-the second metal pattern 141.

Meanwhile, as shown in FIG. 1, if the first metal pattern 131 to the seventh metal pattern 134 is equipped on an outer surface and exposed, the first to the fourth metal pattern 142 can function as a kind of a contact pad. Also, even though it is not shown, a solder resist layer can be equipped to expose a part of the metal pattern and at the same time protect other parts of the metal pattern and the insulating member. Also, various surface treatment layers such as a nickel-gold plating layer may be disposed on a surface of the metal patterns exposed outside of the solder resist layer.

Graphite or graphene normally has a layered structure and the interlayer bonding between each layer is relatively small. Thus, when graphite or graphene is used for the first heat transfer structure 100, damage can occur if the layers of the graphite or graphene are separated in the process of manufacturing the first heat transfer structure 110 or the circuit board 100 including the first heat transfer structure 110. Also, reliability may decrease due to layer detachment of the graphite or the graphene even after completing the circuit board 100.

To solve these problems, in one embodiment of the present inventive concept, a primer layer 111 is equipped on the surface of the first heat transfer structure 110.

In one embodiment, the primer layer 111 may consist of primers including isopropyl alcohol (IPA) or acrylic silane. Also, the primer layer 111 may consist of MPS (3-(trimethoxysilyl)propyl methacrylate), and silane-based additives may be added.

By equipping the primer layer on the surface of the first heat transfer structure 110, the interlayer bonding of the graphite or graphene may increase, and as a result, damage risks when manufacturing the first heat transfer structure 110 and the circuit board 100 including the first heat transfer structure 110 may decrease. Also, the reliability may increase after completing manufacturing the circuit board 100.

Meanwhile, if the surfaces of the first heat transfer structure 110 and the insulating member are in direct contact, a gap can form between the first heat transfer structure 110 and the insulating member when processing reflow or solder pot. This is called delamination. Here, the above-described primer layer 111 may function to reinforce the attachment between the first heat transfer structure 110 and the insulating layer.

Figure 10A:
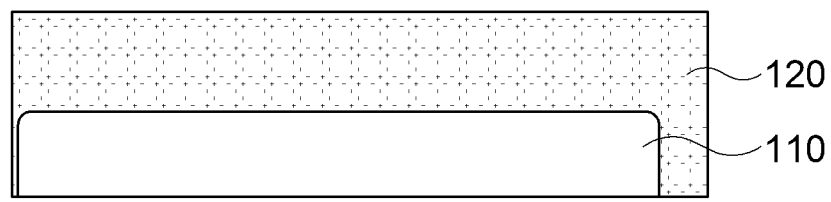
FIG. 10A is a view schematically showing a result of a reflow test with a primer layer equipped on a surface of a heat transfer structure.
Figure 10B:
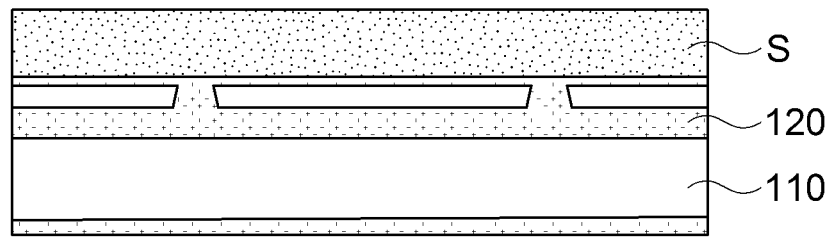
FIG. 10B is a view schematically showing a result of a solder pot test with the primer layer equipped on a surface of the heat transfer structure.
Figure 11B:
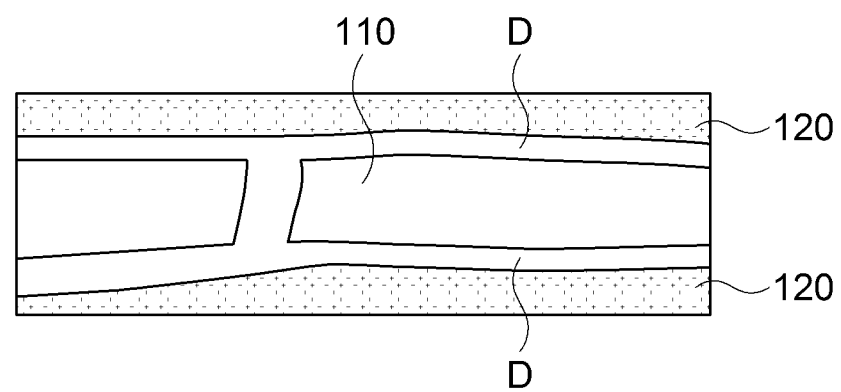
FIG. 11B is a view schematically showing a result of a solder pot test with the insulating member in direct contact with the heat transfer structure.
Figure 11B:
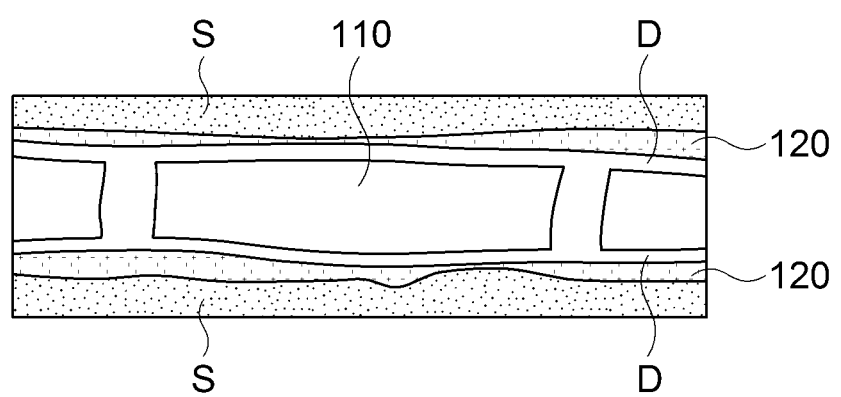
Figure 12:
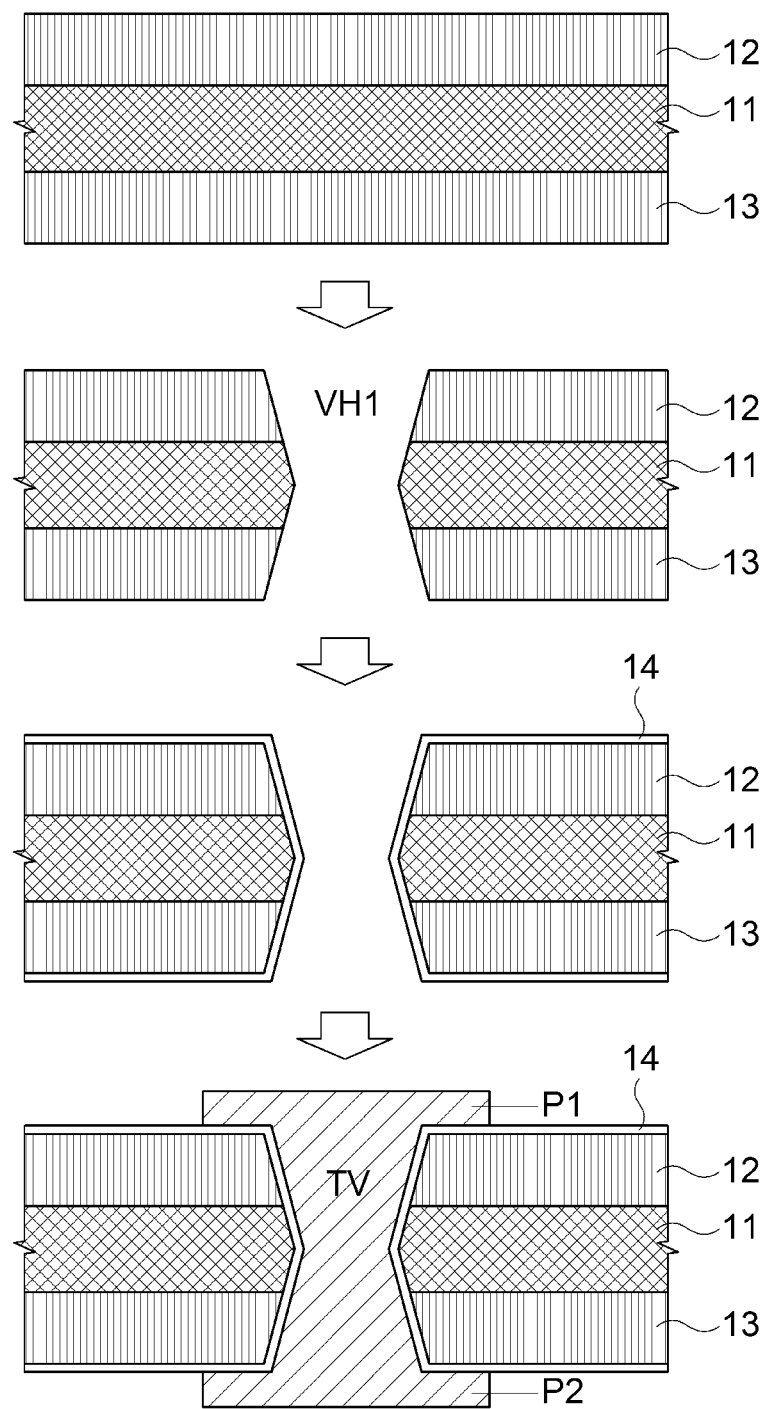
FIG. 12 is a view showing a process of handling a core member in accordance with an embodiment of the present inventive concept.

FIG. 10A is a view schematically showing a result of a reflow test with a primer layer 111 equipped on a surface of a heat transfer structure, FIG. 10B is a view schematically showing a result of a solder pot test with the primer layer 111 equipped on a surface of the heat transfer structure, FIG. 11A is a view schematically showing a result of a reflow test with an insulating member in direct contact with the heat transfer structure, FIG. 11B is a view schematically showing a result of a solder pot test with the insulating member in direct contact with the heat transfer structure and FIG. 12 is a view showing a process of handling a core member in accordance with an embodiment of the present inventive concept.

Referring to FIGS. 10A to 11B, a gap D may be formed when processing reflow or solder pot without the primer layer 111, but it can be understood that the attachment can be enhanced between the first heat transfer structure and the insulating member. Here, the heat transfer structure can stand for at least one of the first heat transfer structure 110 or the below-described second heat transfer structure.

Accordingly, in the circuit board 100 according to one embodiment of the present inventive concept, delamination between the first heat transfer structure 110 and the insulating member may be reduced.

Meanwhile, referring to FIG. 1 or the like again, when the primer layer 111 is equipped on the surface of the first heat transfer structure 110, the above-described first via V1 or the second via V2 may be in contact directly with the first heat transfer structure 110, especially with the graphite or the graphene by penetrating the primer layer 111. Accordingly, the decrease in the performance of heat transfer due to the primer layer 111 can be minimized.

In another embodiment, a first heat transfer structure 110 may be formed by arranging a plurality of monomers 110-1, 110-2, 110-3, and 110-4 formed of primer layers 111 on a surface of a graphite or a graphene. Here, the monomer may have a primer layer 111 disposed on the surface of the graphite or the graphene stacked of at least one layer.

At this time, in each monomer, an XY plane of the graphite or the graphene is arranged in parallel to a vertical direction to maximize the heat transfer performance in the vertical direction. Thus, heat generated from a first electronic component 500 travels to the first heat transfer structure through a first metal pattern 131 and a first via V1, and quickly travels to the bottom following the XY plane of the monomer, then through a second via V2 and a second metal pattern 141.

Also, each monomer may be in contact when arranged horizontally. That is, each monomer, where the XY plane of the graphite or the graphene is arranged in parallel to the vertical direction, may be continuously arranged in a Z-axis direction of the graphite or the graphene.

Accordingly, in the path of heat transfer, the decrease in the performance of heat transfer due to the primer layer can be minimized and at the same time, the volume of the whole first heat transfer structure 110 may increase. Also, based on the same volume of the first heat transfer structure 110, the greater the number of monomers 110-1 through 110-4, the fewer layers of graphite or graphene that consist in each monomer. As a result, compressive force distributed on each layer of the graphite or the graphene will increase, since the compressive force by the primer layer 111 is distributed on graphite or graphene consisting of fewer layers. Thus, the delamination of the layers of the graphite or the graphene may be reduced.

On the other hand, between the terminals of the first electronic component 500, the terminal to be connected to the first metal pattern 131 may be electrically connected to an extra ground terminal that is not shown. Here, the ground terminal may be equipped on at least one of the circuit board 100 or the additional board 800.

Also, between the terminals of the first electronic component 500, the terminal to be connected to the first metal pattern 131 can be a dummy terminal. Here, the dummy terminal may function only as a path to transfer the heat of the first electronic component 500 to an outside of the first electronic component 500.

Referring to FIGS. 1 to 9, the circuit board 100 in accordance with an embodiment of the present inventive concept may include a core member 10. The core member 10 strengthens the hardness of the circuit board 100 to reduce the problems concerning warpage. Also, by including a substance of high heat conductivity in the core member 10, overheating problems can be reduced by dispersing the heat generated from regional area like the above described hot spots to other areas of the circuit board 100.

Meanwhile, a first top insulation layer 121 is equipped on a top surface of the core member 10 and a first bottom insulation layer 121' is equipped on a bottom of the core member 10. Also, if needed, a second top insulation layer 122 and a second bottom insulation layer 122' may be additionally added.

In another embodiment, a second heat transfer structure may be included in the core member 10. For instance, the core member 10 may include a first core layer 11 consisting of graphite or graphene. Here, graphite or such has high heat conductivity in the XY plane direction, accordingly, heat may be diffused effectively and quickly.

In one embodiment, the second heat transfer structure can be directly in contact with a surface of the first heat transfer structure 110. For instance, a surface of the second heat transfer structure may be exposed by a first cavity C1 equipped on the core member 10 and the first heat transfer structure 110 may be in contact with the first cavity C1. In another embodiment, a substance of high heat conductivity may be disposed in an area between the second heat transfer structure and the first heat transfer structure 110. Here, a Thermal Interface Material (TIM) may be used for the high heat conductivity substance. In this TIM, polymer-metal composition, ceramic composition, or carbon composition etc. may be included. For instance, a substance of epoxy and carbon fiber mixture (heat conductivity about 660 W/mK), silicon nitride ($Si_3N_3$, heat conductivity about 200~320 W/mK), epoxy, and boron nitride (BN, heat conductivity about 19 W/mK) can be used as the Thermal Interface Material. Accordingly, heat flowing into the first heat transfer structure 110 can be dispersed not only in the vertical direction, but also in the horizontal direction through the second heat transfer structure.

Therefore, by contacting the first heat transfer structure 110 and the second heat transfer structure directly or through the TIM, heat from the first electronic component 500 can be quickly transferred to the first heat transfer structure 110 and quickly dispersed compared to transferring heat only to the bottom. Also, from the circuit board 100 point of view, rather than heating up only in particular areas like the hot spot, reliability can be increased because the heat may be dispersed more effectively to the entire circuit board 100, reducing the temperature deviation of the components or elements equipped on the circuit board 100. Also, the heat is dispersed throughout the entire circuit board 100, thus the area of radiation can be increased since the entire circuit board 100 functions as a radiation board.

In one embodiment of the present inventive concept, a first circuit pattern P1 and a second circuit pattern P2 may be equipped on the surface of the core member 10, and the first circuit pattern P1 and the second circuit pattern P2 can be electrically connected by a through via TV. Also, the first circuit pattern P1 may be connected to the third metal pattern 133 by the fourth via V4, and the second circuit pattern P2 may be connected to the fourth metal pattern 142 by the fifth via V5. In addition, the fourth metal pattern 142 may be connected to a connection pad 810 of the additional board 800 by the solder S. Accordingly, electrical signals may be transceived between the first electronic component 500 and the additional board 800.

Meanwhile, a second core layer 12 may be equipped on a surface of the first core layer 11, and a third core layer 13 may be equipped on the other surface of the first core layer 11. In one embodiment, at least one of the second core layer 12 and the third layer 13 may consist of an insulation substance such as PPG (polypropylene glycol). In another embodiment, the second core layer 12 and the third core layer 13 may consist of metals of copper or Invar etc. In another embodiment, the first core layer 11 may consist of Invar and the second core layer 12 and the third core layer 13 may consist of copper. Here, if one of the second core layer 12 and the third core layer 13 consists of a conductive substance, a problem of a signal being transferred to an unwanted path may occur, since the first circuit pattern P1 and the second circuit pattern P2 are equipped on the surface of the core member 10. Thus a method to insulate the surface of the core member 10 may be equipped.

In one embodiment, the second electronic component 200 may be inserted in the second cavity C2 of the core member 10. In addition, the second electronic component 200 is connected to the seventh metal pattern 134 by the sixth via V6, and to the sixth metal pattern 144 by the seventh via V7. Meanwhile, the second electronic component 200 may be a passive element such as an inductor or a capacitor, if needed, or active elements such as an IC (integrated circuit) may be loaded as the second electronic component 200. In particular, if the second electronic component 200 is a capacitor, a terminal of the first electronic component 500 connected to the seventh metal pattern 134 may be a power terminal. That is, the second electronic component 500 may be loaded as a decoupling capacitor to function to reduce the power noise of the first electronic component 500.

In that case, shortening the distance between the second electronic component 200 and the first electronic component 500 may enhance the noise reduction effect. For this, at least a portion of the second electronic component 200 is positioned on a vertical bottom area of the first electronic component 500 in the circuit board 100 according to one embodiment of the present inventive concept.

Even though it is not shown, a recess dent on a portion of the core member 10 may be included instead of a cavity penetrating the core member 10, and the first heat transfer structure 110 or the second electronic component 200 may be inserted into this recess.

Meanwhile, referring to FIG. 1, the thickness of the first heat transfer structure 110 may be thicker than a thickness of the second circuit pattern P2 and the first circuit pattern P1 added together. Moreover, the top surface of the first heat transfer structure 110 may be positioned closer to the circuit board 100 than the first circuit pattern P1. Accordingly, the heat capacity of first heat transfer structure 110 increases, therefore resulting in an increase in its ability to absorb heat. Also, the distance between the first heat transfer structure 110 and the hot spot is decreased, thus the time for the heat of the hot spot to travel to the first heat transfer structure 110 is reduced.

Also, referring to FIG. 2, the second top insulation layer 122 may be formed on a top surface of the first top insulation layer 121. In that case, the height of the first via V1 or the second via V2, placed between the outer surface of circuit board 100 and the first heat transfer structure 110, may be shorter than a via connecting the outer surface of the circuit board to inner patterns P1' and P2' to increase the heat capacity of the first heat transfer structure 110 and at the same time, increase the speed of heat dispersion.

Referring to FIG. 6, an insulating layer 14 may be equipped on the surface of the core member 10. In one embodiment, the first core layer 11 to the third core layer 13 may be both heat conductive and electroconductive. Therefore, when placing the first circuit pattern P1 on the surface of the core member 10, there is a need to prevent current from carrying onto unwanted paths by the core member 10. Here, the insulating layer 14 may be formed on the surface of the core member 10 by vapor deposition of parylene or such. That is, when a through via hole is processed on the core member to form the through via TV shown in FIG. 6, the insulation layer 14 may be formed inside the through via TV by supplying insulated substance on the surface of the core member 10. Accordingly, insulation between the through via TV, the first circuit pattern P1, the second circuit pattern P2, and the core member may be provided.

Meanwhile, in one embodiment, a core via hole may be formed to expose a part of the first core layer 11 by penetrating the second core layer 12 and the third core layer 13. In the core via hole, an eighth via V8 consisting of conductive substance may be in direct contact with the first core layer 11. Here, when forming the insulating layer 14 on the surface of the core member 10 with the core via hole equipped, the insulating layer 14 may be additionally formed on the exposed first core layer 11, thus the first core layer 11 and the eighth via V8 may be in contact with the insulating layer 14 in between. Therefore, when the heat transferred to the eighth via V8 in direct contact (or indirect when there is an insulating layer 14) with the first core layer 11, the heat can be dispersed quickly following the first core layer 11 in a horizontal direction of the circuit board 100.

In one embodiment, the second heat transfer structure may consist of graphite of graphene, in this case the graphite or the graphene normally has a relatively lower interlayer bonding between each layer. Thus, the second heat transfer structure may be damaged in the process of manufacturing the circuit board 100 or the reliability may decrease due to layer detachment of the graphite or the graphene even after completing the circuit board 100.

As shown in FIG. 6, a penetration hole 11C is equipped in the first core layer 11, the second core layer 12 and the third core layer 13 can be connected as a whole to firmly support the first core layer 11. Accordingly, the interlayer bonding may be reinforced even though the first core layer 11 is consisted of graphite or the like.

Referring to FIG. 7, an example of a first core layer 11 equipped with a primer layer 111 on an outer surface is shown. That is, by equipping the primer layer 111 on the outer surface of the graphite sheet, the interlayer bonding may be enhanced. Here, the primer layer 111 not only enhances the interlayer bonding between each graphite layers, but enhances the interlayer bonding between the first core layer 11 and the second core layer 12 and the first core layer 11 and the third core layer 13.

In another embodiment, referring to FIG. 8, a first core layer 11 may be formed by arranging monomers 11-1, 11-2, 11-3, and 11-4 equipped with primer layers 111 and stacking them vertically on a surface of a graphite. In this case, horizontal radiation of a first core layer 11 may be minimized and at the same time delamination the first core layers in a vertical direction can be eased.

In another embodiment, referring to FIG. 9, a first core layer 11 may be formed by arranging monomers 11-1, 11-2, 11-3, and 11-4 equipped with primer layers 111 and stacking them horizontally on a surface of a graphite. Here, an XY plane of the graphite may be arranged parallel to a vertical direction. In this case, the horizontal radiation may decrease a little, but the vertical radiation using the first core layer 11 may increase.

FIG. 12 is a drawing to explain a process of handling a core member in accordance with an embodiment of the present inventive concept. Referring to FIG. 12, a via hole is formed on a core member including a first core layer 11, a second core layer 12, and a third core layer 13, an insulating layer 14 is formed on a surface of the core member including an inner surface of the via hole, then a first circuit pattern P1, a through via TV, and a second circuit pattern P2 may be formed. Accordingly, insulation between the first pattern P1 or such and the core member 10 may be achieved.

In accordance with an embodiment of the present inventive concept, the radiation performance as well as miniaturization and weight reduction of a circuit board may be enhanced.

Also, since the radiation performance may be enhanced as well as securing the reliability of the circuit board, the heating problems due to high performance of electronic components can be solved.

And also, in one embodiment, the problem of power noise can be reduced as well as the heating problems in local areas such as hot spots can be solved at the same time.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A circuit board comprising:
   a core layer including graphite or graphene and having a cavity formed therein;
   a first heat transfer structure disposed in the cavity and having a greater thermal conductivity in a thickness direction of the circuit board than in a planar direction of the circuit board;
   an insulating member covering the core layer and the first heat transfer structure;
   a first primer layer comprising silanic primers and disposed on substantially entire surfaces of the first heat transfer structure in such a way that the first primer layer connects the first heat transfer structure to the core layer and/or to the insulating member; and
   a via formed in the insulating member and penetrating through the first primer layer to have a first surface in contact with the first heat transfer structure,
   wherein at least a portion of the first heat transfer structure comprises a plurality of unit layers,
   wherein the unit layers each include graphite or graphene, and
   wherein a second primer layer is disposed on at least one surface of at least one unit layer.

2. The circuit board according to claim 1, further comprising:
   a metal pattern in contact with a second surface of the via.

3. The circuit board according to claim 2, further comprising:
   a joining member in contact with the metal pattern; and
   a first electronic component in contact with the joining member.

4. The circuit board according to claim 3, wherein the first electronic component includes a first area and a second area, the temperature of the second area rising to a higher temperature than that of the first area when the first electronic component is operated, and a portion of the second area being in contact with the joining member.

5. The circuit board according to claim 2, wherein the first heat transfer structure is a polyhedron and a plurality of vias are in contact with the same surface of the first heat transfer structure.

6. The circuit board according to claim 2, wherein the second primer layer includes silanic primers.

7. The circuit board according to claim 2, wherein the first heat transfer structure is a cylinder or a faceted cylinder and a plurality of vias are in contact with the same surface of the first heat transfer structure.

8. The circuit board according to claim 1, further comprising:
   a first via in contact with the first heat transfer structure, a first surface of the first via being in contact with the graphite or the graphene of the first heat transfer structure;
   a first metal pattern in contact with a second surface of the first via;
   a second via in contact with the first heat transfer structure, a first surface of the second via being in contact with the graphite or the graphene of the first heat transfer structure; and
   a second metal pattern in contact with a second surface of the second via.

9. The circuit board according to claim 8, further comprising:
   a first joining member in contact with the first metal pattern; and a first electronic component in contact with the first joining member.

10. The circuit board according to claim 9, further comprising:
a second joining member in contact with the second metal pattern;
an additional board in contact with the second joining member,
wherein heat generated by the first electronic component is transferred to the additional board through the first joining member, the first metal pattern, the first via, the first heat transfer structure, the second via, the second metal pattern, and the second joining member.

11. The circuit board according to claim 10, wherein the second joining member is coupled to a surface of a heat sink comprising a heat-conductive material.

12. The circuit board according to claim 11, wherein the second joining member comprises a heat-conductive material.

13. The circuit board according to claim 10, wherein the first electronic component includes a first area and a second area, the second area having a clock speed higher than that of the first area, and a distance between the second area and the first joining member is shorter than a distance between the first area and the first joining member.

14. The circuit board according to claim 13, wherein the second joining member is in contact with a top surface of a heat sink comprising a heat-conductive material, and the second joining member comprises a heat-conductive material.

15. The circuit board according to claim 1, wherein a first electronic component is disposed on a top surface of the circuit board and at least a portion of the first heat transfer structure is positioned below the first electronic component.

16. The circuit board according to claim 15, further comprising a second electronic component, wherein at least a portion of the second electronic component is disposed inside the insulating member and at least a portion of the second electronic component is positioned below the first electronic component.

17. The circuit board according to claim 16, wherein the first electronic component includes a first area and a second area, the temperature of the second area rising to a higher temperature than that of the first area when the first electronic component is operated, and the second area is closer to the first heat transfer structure than the first area.

18. The circuit board according to claim 1, wherein an XY plane of the graphite or graphene of each of the unit layers is parallel to the thickness direction of the circuit board, and the unit layers are arranged in a Z direction of the graphite or graphene.

19. The circuit board according to claim 1, further comprising a thermal interface material disposed between the first heat transfer structure and the inner wall of the cavity.

20. The circuit board according to claim 19, wherein the thermal interface material comprises at least one selected from the group consisting of a polymer-metal composition, a ceramic composition, and a carbon composition.

21. The circuit board according to claim 1, wherein the second primer layer comprises at least one selected from the group consisting of isopropyl alcohol (IPA), acrylic silane, and 3-(trimethoxysilyl)propyl methacrylate.

* * * * *